(12) United States Patent
Akimoto et al.

(10) Patent No.: US 9,887,113 B2
(45) Date of Patent: Feb. 6, 2018

(54) SEMICONDUCTOR CHIP TRAY

(71) Applicant: Synaptics Japan GK, Tokyo (JP)

(72) Inventors: Koji Akimoto, Tokyo (JP); Hisao Nakamura, Tokyo (JP); Tsutomu Fukaya, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 50 days.

(21) Appl. No.: 14/830,213

(22) Filed: Aug. 19, 2015

(65) Prior Publication Data

US 2016/0071752 A1 Mar. 10, 2016

(30) Foreign Application Priority Data

Sep. 9, 2014 (JP) .................... 2014-183216

(51) Int. Cl.
*H01L 21/673* (2006.01)
*B65D 1/36* (2006.01)

(52) U.S. Cl.
CPC .......... *H01L 21/67333* (2013.01); *B65D 1/36* (2013.01)

(58) Field of Classification Search
CPC ......... H01L 21/67333; H01L 21/67359; H01L 21/67336; H01L 21/67346; B65D 85/48
USPC ............................... 206/711, 725
See application file for complete search history.

(56) References Cited

U.S. PATENT DOCUMENTS

| 2005/0202597 A1* | 9/2005 | Takahashi | H01L 24/05 438/113 |
| 2005/0285282 A1* | 12/2005 | Inoke | H01L 21/67333 257/787 |

FOREIGN PATENT DOCUMENTS

| JP | 2001035871 A | 2/2001 |
| JP | 2005212797 A | 8/2005 |
| JP | 2010040681 A | 2/2010 |

* cited by examiner

Primary Examiner — Steven A. Reynolds
Assistant Examiner — Mollie Impink
(74) Attorney, Agent, or Firm — Patterson + Sheridan, LLP

(57) ABSTRACT

A semiconductor chip tray is provided that includes a support plate, a first protruding portion, a second protruding portion and a recess. The first protruding portion forms a housing space for a semiconductor chip by being provided on a top surface of the support plate. The second protruding portion is provided on a bottom surface of the support plate, and is fitted to an outer periphery of the first protruding portion of another semiconductor chip tray when the tray is stacked so as to overlap the other tray. The recess is provided on the bottom surface of the support plate. The recess faces a part of the first protruding portion of another chip tray when the tray is stacked so as to overlap the other tray. The recess is formed extending up to an outside of the first protruding portion from the housing space formed by the first protruding portion.

10 Claims, 11 Drawing Sheets

SEMICONDUCTOR CHIP TRAY

CROSS-REFERENCE TO RELATED APPLICATIONS

The Present application claims priority from Japanese application JP 2014-183216 filed on Sep. 9, 2014, the content of which is hereby incorporated by reference into this application.

BACKGROUND

The present invention relates to a semiconductor chip tray, and in particular, to semiconductor chip trays that are used in a state in which the semiconductor chip trays are stacked so as to overlap each other when housing, storing, and transporting semiconductor chips.

Semiconductor chip trays are used in a state of being stacked so as to overlap each other with semiconductor chips housed therein, in case that the semiconductor chip trays are packed and transported or that the semiconductor chip trays are transported along the process flow. In general, there is a need to make a substrate of a semiconductor chip thin. Accordingly, there is a need to reduce the warpage of a semiconductor chip tray. In particular, in the case of a liquid crystal display (LCD) driver integrated circuit (IC), a tendency for the length of a long side to increase becomes noticeable with an increase in the definition of a display panel. Accordingly, there is a stronger demand for reducing the warpage of the chip tray.

On the other hand, JP-A-2005-212797 discloses a technique for preventing the occurrence of chipping, tray scraping, and the like due to the corners of a semiconductor chip being in contact with the side walls of a chip pocket when the semiconductor chip is housed in the chip pocket of the chip tray (referred to as a tray pocket in JP-A-2005-212797). When chip pockets are formed by division using ribs arranged in a matrix, no rib is present in a portion that is in contact with the corner of a semiconductor chip.

JP-A-2001-035871 discloses a chip tray in which a through hole is provided on the bottom surface of a chip housing recess. In a step of forming a bump on the chip surface, the chip is adsorbed through the through hole.

JP-A-2010-040681 discloses a chip tray to prevent chipping or scratching of a semiconductor chip. A thin film made of a release material is formed on the chip tray surface including a recess that is a housing pocket to house a chip therein.

SUMMARY

A semiconductor chip tray is provided that includes a support plate, a first protruding portion, a second protruding portion and a recess. The first protruding portion forms a housing space for a semiconductor chip by being provided on a top surface of the support plate. The second protruding portion is provided on a bottom surface of the support plate, and is fitted to an outer periphery of the first protruding portion of another semiconductor chip tray when the tray is stacked so as to overlap the other tray. The recess is provided on the bottom surface of the support plate. The recess faces a part of the first protruding portion of another chip tray when the tray is stacked so as to overlap the other tray. The recess is formed extending up to an outside of the first protruding portion from the housing space formed by the first protruding portion.

In another embodiment, a semiconductor chip tray is provided that includes a support plate, a first protruding portion, a second protruding portion, a first recess, a second recess, and a third recess. The first protruding portion is provided on a top surface of the support plate. The first recess forms a plurality of chip pockets by being provided in the first protruding portion. The second recess forms a flow path of air for combining the plurality of chip pockets by being provided in the first protruding portion. The second protruding portion is provided on a bottom surface of the support plate, and is fitted to an outer periphery of the first protruding portion of another semiconductor chip tray when the semiconductor chip tray is stacked so as to overlap the other semiconductor chip tray. The third recess is provided on the bottom surface of the support plate. The third recess faces a part of the first protruding portion of another semiconductor chip tray when the semiconductor chip tray is stacked so as to overlap the other semiconductor chip tray. The third recess is formed extending up to an outside of the first protruding portion from the housing space formed by the first protruding portion.

In yet another embodiment, a semiconductor chip tray is provided that includes a support plate, an outer peripheral rib provided on a top surface side of the support plate, and a recess provided on a bottom surface side of the support plate. The outer peripheral rib is a strip-shaped protruding portion having a fixed height, and forms a housing space for housing a semiconductor chip thereinside by being provided on the top surface of the support plate. When the semiconductor chip tray is stacked so as to overlap another semiconductor chip tray having the same configuration as the semiconductor chip tray, a part of the outer peripheral rib faces a recess of the other semiconductor chip tray, and the recess is provided at a position where a flow path of air from the housing space to an outside through the recess is formed.

DETAILED DESCRIPTION

Introduction

Figure 1:
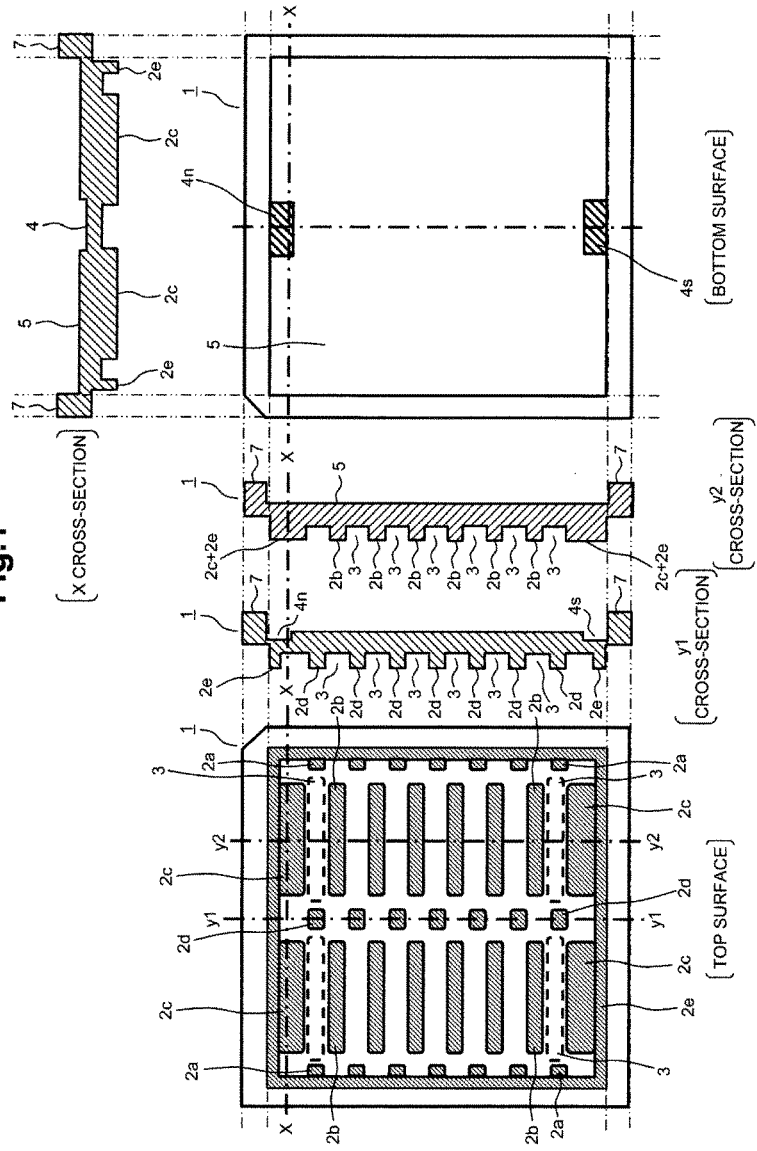
FIG. 1 is a diagram showing the structure of a semiconductor chip tray according to a first embodiment.

The present inventors have studied JP-A-2005-212797, JP-A-2001-035871, and JP-A-2010-040681, and have found that there are the following new problems.

In the chip tray disclosed in JP-A-2005-212797, a semiconductor chip is housed in a chip pocket formed by division using a rib. However, a plurality of chip pockets are connected to each other to form a common space. In other words, one large cavity, in which a position where each IC chip is housed is defined by the rib, is formed. When such chip trays are stacked so as to overlap each other, if the upper chip tray is lifted, a problem that the lower chip tray is adsorbed and lifted (sticking due to vacuum suction) may occur. This phenomenon occurs due to chip pockets interposed between the upper and lower chip trays that are in a reduced pressure state, which is the same state as vacuum suction. When the warpage of the chip tray is reduced, the airtightness between the upper and lower chip trays is increased. Accordingly, this problem has become more noticeable.

Such a problem can be solved by providing a through hole on the bottom surface of the chip pocket so that the vacuum suction between the upper and lower chip trays is released as in the chip tray disclosed in JP-A-2001-035871. However, a through hole may not be able to be provided depending on the size of an IC chip to be housed. For example, in the case of an LCD driver IC, it is difficult to provide a through hole since the short side is extremely short.

Such a problem of sticking due to vacuum suction can be solved by forming a release material in a thin film shape on the tray surface as disclosed in JP-A-2010-040681. However, since a step of forming a thin film made of a release material is added, an increase in the cost of manufacturing the chip tray occurs. In addition, since the release material is a different material from the tray body, the release material becomes foreign matter when trays are rubbed against each other or the release material is rubbed against a housed chip due to vibration or the like during transport or during transport for the next step. This may contaminate the IC chip.

In addition, according to another technique in the related art, an interlayer sheet can be inserted between trays overlapping each other. However, additional work, such as inserting the interlayer sheet at the time of packing and removing the interlayer sheet when taking out the IC chip, is required. The interlayer sheet itself also costs.

In addition, according to still another technique in the related art, there is a method of preventing the occurrence of sticking by performing a satin finish on the contact surfaces of trays. However, in the case of an IC chip having a gold bump on the chip surface, such as an LCD driver IC, surface shape processing, such as a satin finish on the bottom surface of a chip tray serving as a lid or processing for forming a recess or a projection, causes problems, such as scratching on the gold bump, chipping of the bump, and peeling. For this reason, the surface shape processing is not preferable. In addition, since adding a blast treatment for the surface shape processing causes an increase in the cost of manufacturing the tray, this is not preferable. Alternatively, the surface shape processing may be performed on a surface in contact with the surface of the outer peripheral rib, that is, a surface in contact with the bottom surface of the chip tray. However, since such surface shape processing is not good in terms of reducing the warpage of the outer peripheral rib and the tray, this is not preferable.

Embodiments of the disclosure prevent the occurrence of sticking due to vacuum suction when trays are stacked, without providing a through hole on the bottom surface of a chip pocket or providing irregularities on the outer peripheral rib and without causing an increase in the cost due to providing an additional processing step for the chip tray or the like.

Although means for solving such a problem will be described below, other objects and novel features of the invention will become apparent from the following description with reference to the accompanying diagrams.

An embodiment is as follows.

That is, a semiconductor chip tray includes a support plate, an outer peripheral rib provided on a top surface side of the support plate, and a recess provided on a bottom surface side of the support plate, and is configured as follows. The outer peripheral rib is a strip-shaped protruding portion having a fixed height, and forms a housing space including a plurality of chip pockets for housing semiconductor chips thereinside by being provided on the top surface of the support plate. The recess on the bottom surface side is formed at a position overlapping a part of the outer peripheral rib when viewed from a direction perpendicular to the top surface of the semiconductor chip tray. When the semiconductor chip tray is stacked so as to overlap another semiconductor chip tray having the same configuration, the recess of another semiconductor chip tray that functions as a lid forms a part of a flow path of air from the housing space of the semiconductor chip tray to an outside.

The effect obtained by the embodiment can briefly be described as follows.

That is, it is possible to prevent the occurrence of sticking due to vacuum suction when semiconductor chip trays are stacked, without providing a through hole on the bottom surface of a chip pocket or providing irregularities on the outer peripheral rib and without causing an increase in the cost due to providing an additional processing step for the semiconductor chip tray or the like.

1. SUMMARY OF THE EMBODIMENTS

First, summary of representative embodiments of the invention disclosed in the application will be described. Reference numerals in drawings in parentheses referred to in description of the summary of the representative embodiments just denote components included in the concept of the components to which the reference numerals are designated.

[1] Chip Tray Having a Recess for Air Vent on the Bottom Surface

A representative embodiment disclosed in the present application is a semiconductor chip tray (1) including a support plate (5), a first protruding portion (2e), a second protruding portion (7) and a recess (4), and is configured as follows.

The first protruding portion forms a housing space for a semiconductor chip (IC chip) by being provided on a top surface of the support plate.

The second protruding portion is provided on a bottom surface of the support plate, and is fitted to an outer periphery of the first protruding portion of another semiconductor chip tray when the semiconductor chip tray is stacked so as to overlap the other semiconductor chip tray.

The recess is provided on the bottom surface of the support plate, faces a part of the first protruding portion of another semiconductor chip tray when the semiconductor chip tray is stacked so as to overlap the other semiconductor chip tray, and is formed extending up to an outside of the first protruding portion from the housing space formed by the first protruding portion.

Therefore, when the semiconductor chip tray (1) is stacked so as to overlap another semiconductor chip tray having the same structure, the recess forms a flow path for air to flow from the housing space of the other semiconductor chip tray to the outside. As a result, it is possible to prevent the occurrence of sticking due to vacuum suction. It is not necessary to provide a through hole on the bottom surface of the chip pocket or to provide irregularities on the outer peripheral rib, and an increase in the cost due to providing an additional processing step for the semiconductor chip tray or the like does not occur.

[2] Formation of a Recess at a Position Deviating from Chip Pockets Divided by Ribs In the item 1, the semiconductor chip tray further includes ribs (2a, 2b, 2c, 2d) that divide the housing space into a plurality of chip pockets (3) by being provided in island shapes on the top surface of the support plate.

When the semiconductor chip tray is stacked so as to overlap another semiconductor chip tray, the recess is formed at a position deviating from all of the plurality of chip pockets of the other semiconductor chip tray.

Therefore, since the recess is not in contact with the surface of an IC chip housed in the chip pocket (3) of the other semiconductor chip tray, it is possible to prevent the occurrence of scratching, chipping, peeling, and the like on the surface bump of the IC chip.

[3] Chip Tray Having a Recess for Air Vent on the Bottom Surface (FIG. 1)

In the item 1, the semiconductor chip tray further includes a plurality of first island-shaped projections (2b, 2c) and a plurality of second island-shaped projections (2a, 2d) that divide the housing space into a plurality of chip pockets (3) by being provided in island shapes on the top surface of the support plate.

The first protruding portion has left and right sides extending in a vertical direction and upper and lower sides extending in a horizontal direction.

The plurality of first island-shaped projections form upper and lower sides of the plurality of chip pockets by being arranged in a plurality of columns (2c, 2b, 2b, 2c) in the vertical direction.

The plurality of second island-shaped projections form left and right sides of the plurality of chip pockets by being arranged in a column (2a, . . . , 2a; 2d, . . . , 2d) in the vertical direction at positions that do not overlap the plurality of columns by the plurality of first island-shaped projections when viewed from the horizontal direction and do not overlap the plurality of first island-shaped projections when viewed from the vertical direction.

The recess includes an upper side recess (4n) disposed on the upper side of the first protruding portion and a lower side recess (4s) disposed on the lower side of the first protruding portion.

Among the plurality of first island-shaped projections, the uppermost first island-shaped projection has an upper side that is in contact with the upper side of the first protruding portion and a lower side located on an inner side rather than the upper side recess, and the lowermost first island-shaped projection has a lower side that is in contact with the lower side of the first protruding portion and an upper side located on an inner side rather than the lower side recess.

Thus, it is possible to obtain the same effect as in the item 2.

[4] Forming a Recess on the Extension Line of a Rib Column that Divides Chip Pockets to the Left and Right (FIG. 1)

In the item 3, the upper side recess and the lower side recess are formed on an extension line of the column (2d, . . . , 2d) in the vertical direction by the plurality of second island-shaped projections.

Therefore, it is possible to maintain the symmetry of the planar shape of the semiconductor chip tray (1). For example, when the housing space is divided into chip pocket columns of two left and right columns by the plurality of second island-shaped projections (2d), the recess (4) is disposed on the center line of the left and right. Therefore, the semiconductor chip tray (1) can be formed symmetrically.

Figure 5:
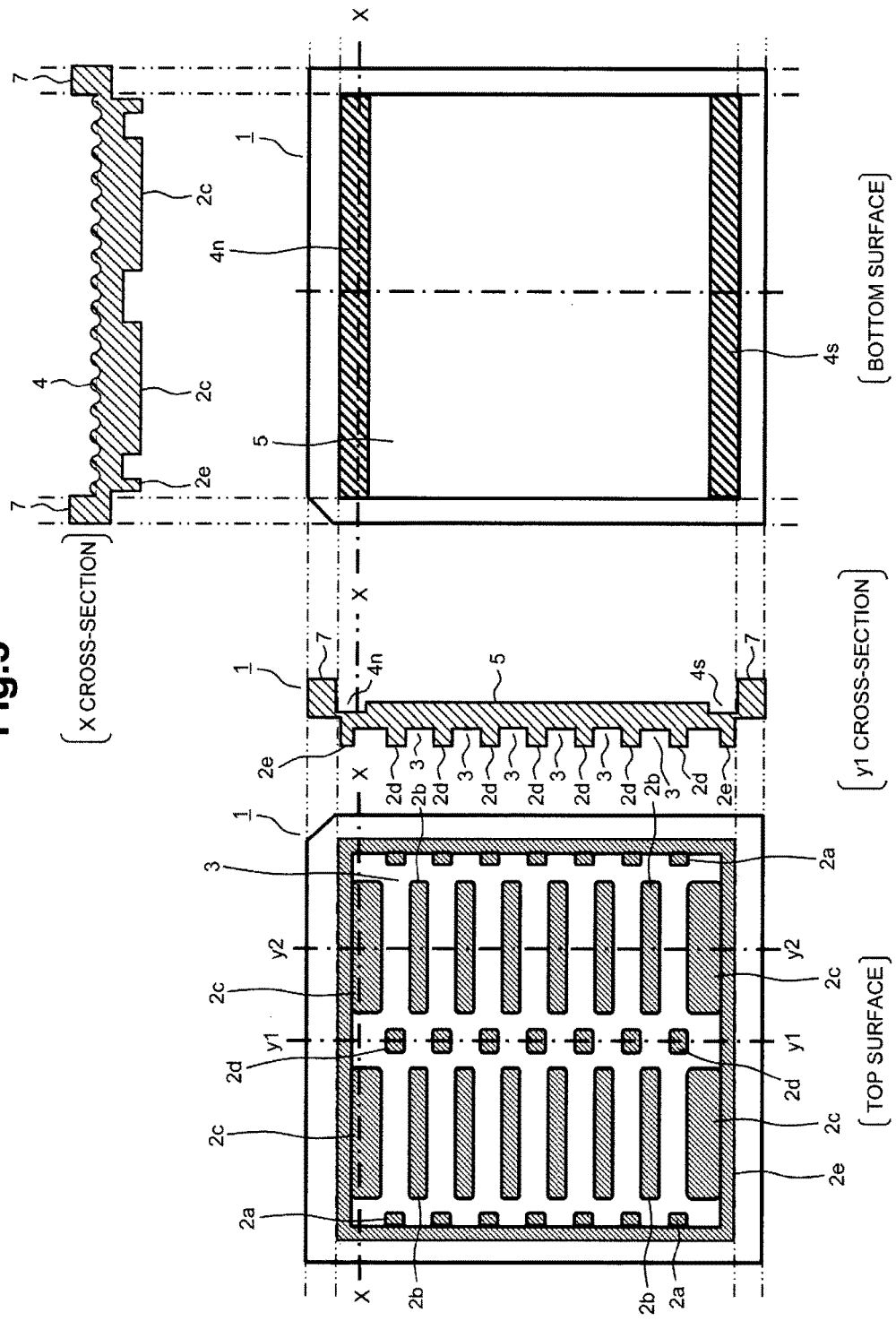
FIG. 5 is a diagram showing the structure of a semiconductor chip tray according to a third embodiment.

[5] Forming a Recess Having Approximately the Same Width as the Width of an Outer Peripheral Rib (First Protruding Portion) (FIG. 5)

In the item 3, the upper side recess and the lower side recess are formed at positions that are in contact with left and right sides of the first protruding portion.

Therefore, it is possible to maintain the symmetry of the planar shape of the semiconductor chip tray (1).

[6] A Recess Includes a Plurality of Projections (FIG. 5, X Cross-Sectional View)

In the item 5, each of the upper side recess and the lower side recess includes a plurality of projections having the same width as a width in the vertical direction.

Therefore, it is possible to reduce the warpage of the semiconductor chip tray (1). The flow path of air between the chip pocket (housing space) and the outside is secured in a gap in the vertical direction between a plurality of projections provided in the upper side recess and the lower side recess. In this case, since the strength of the chip tray is reinforced by the plurality of projections (for example, wavy projections) that are provided, warpage is reduced.

[7] Cross-Sections of a Plurality of Projections in a Recess Have Wave Shapes (FIG. 5, X Cross-Sectional View)

In the item 6, the plurality of projections included in each of the upper side recess and the lower side recess have wavy sectional shapes.

Therefore, it is possible to reduce the warpage of the semiconductor chip tray (1).

Figure 6:
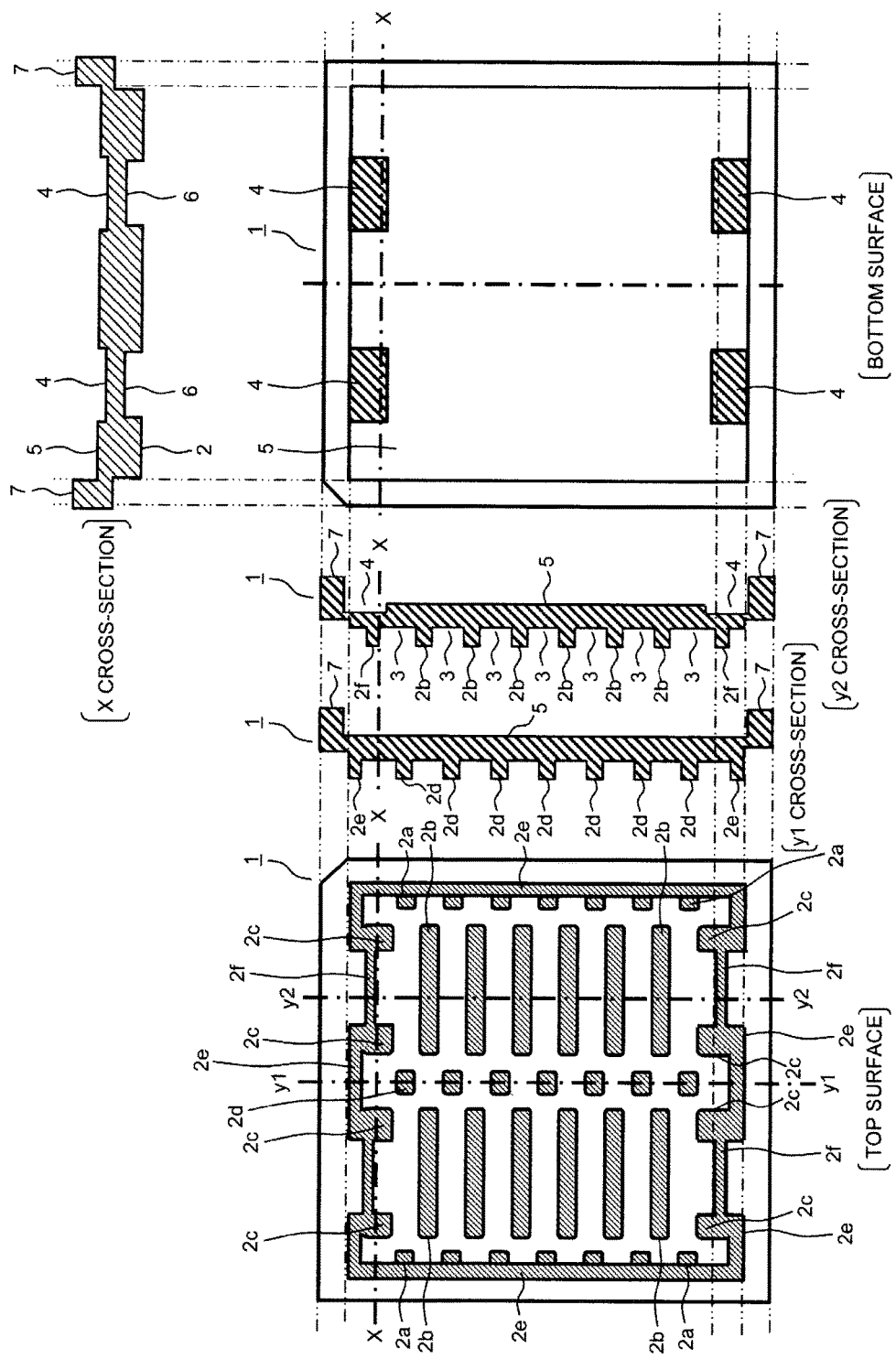
FIG. 6 is a diagram showing the structure of a semiconductor chip tray according to a fourth embodiment.

[8] Reducing the Width of a Portion of a Rib Facing the Recess (FIG. 6)

In the item 3, when the semiconductor chip tray is stacked so as to overlap another semiconductor chip tray, a width of a portion (2f) of the first protruding portion facing an upper side recess and a lower side recess of the other semiconductor chip tray is smaller than widths of the upper side recess and the lower side recess.

Therefore, even if the recess (4) is provided in a belly portion of an IC chip of the chip pocket (3), the recess (4) and the IC chip cannot be brought into contact with each other.

Figure 4:
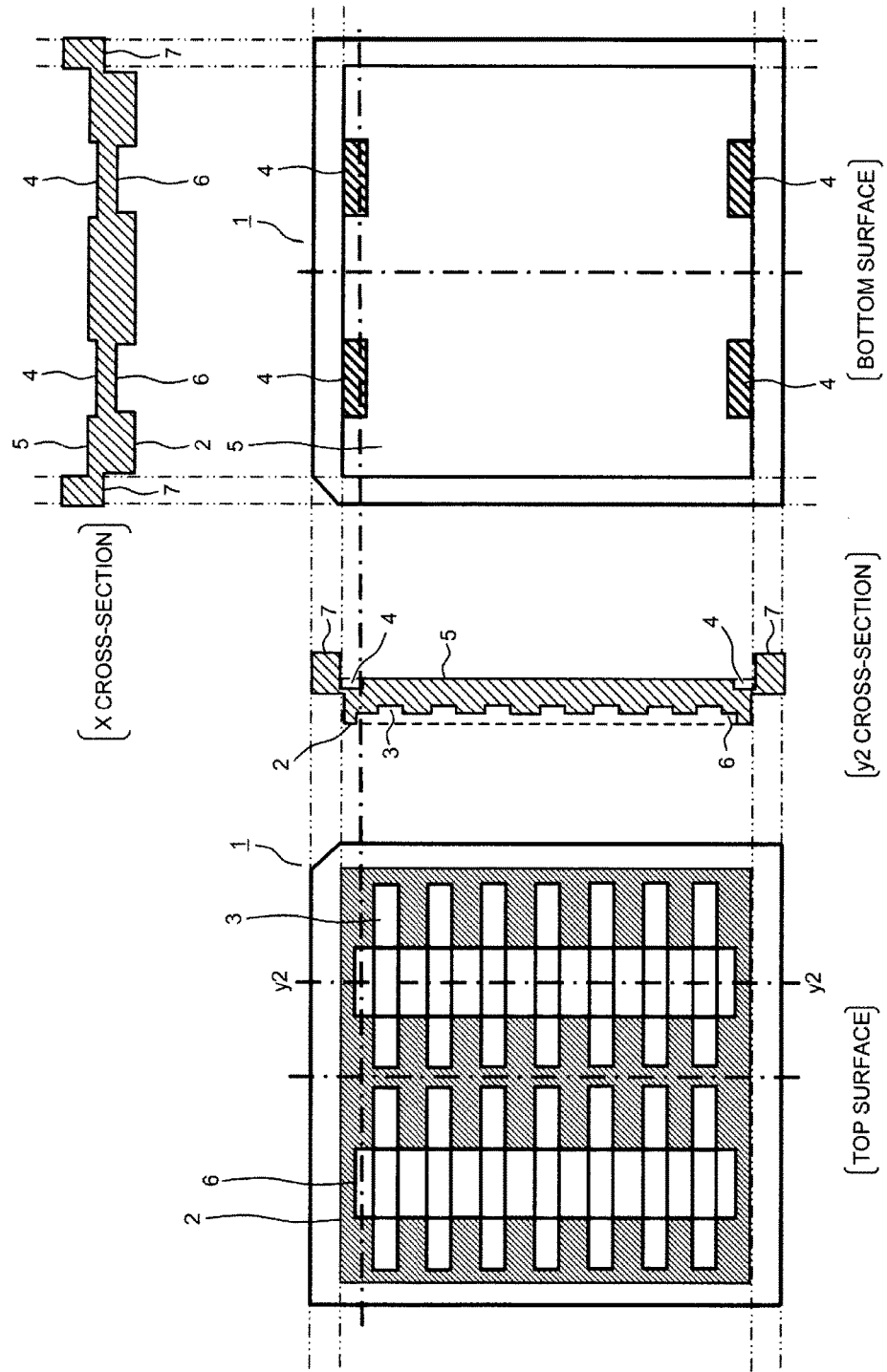
FIG. 4 is a diagram showing the structure of a semiconductor chip tray according to a second embodiment.

[9] Chip Tray Having a Recess for Air Vent on the Bottom Surface (FIG. 4)

A representative embodiment disclosed in the present application is a semiconductor chip tray (1) including a support plate (5), a first protruding portion (2), a second protruding portion (7), a first recess (3), a second recess (6), and a third recess (4), and is configured as follows.

The first protruding portion is provided on a top surface of the support plate.

The first recess forms a plurality of chip pockets (3) by being provided in the first protruding portion.

The second recess forms a flow path of air for combining the plurality of chip pockets by being provided in the first protruding portion.

The second protruding portion is provided on a bottom surface of the support plate, and is fitted to an outer periphery of the first protruding portion of another semiconductor chip tray when the semiconductor chip tray is stacked so as to overlap the other semiconductor chip tray.

The third recess is provided on the bottom surface of the support plate, faces a part of the first protruding portion of another semiconductor chip tray when the semiconductor chip tray is stacked so as to overlap the other semiconductor chip tray, and is formed extending up to an outside of the first protruding portion from the housing space formed by the first protruding portion.

Thus, it is possible to obtain the same effect as in the item 1.

[10] Chip Tray Having a Recess for Air Vent on the Bottom Surface

A representative embodiment disclosed in the present application is a semiconductor chip tray (1) including a support plate (5), an outer peripheral rib (2e) provided on a top surface side of the support plate, and a recess (4) provided on a bottom surface side of the support plate, and is configured as follows.

The outer peripheral rib is a strip-shaped protruding portion having a fixed height, and forms a housing space for housing a semiconductor chip thereinside by being provided on the top surface of the support plate. Here, "fixed height" does not mean exactly the same height mathematically, but includes error that is normally permitted in the industry.

When the semiconductor chip tray is stacked so as to overlap another semiconductor chip tray having the same configuration as the semiconductor chip tray, a part of the outer peripheral rib faces a recess of the other semiconductor chip tray, and the recess is provided at a position where a flow path of air from the housing space to an outside through the recess is formed.

Thus, it is possible to obtain the same effect as in the item 1.

[11] Island-Shaped Ribs that Divide the Housing Space

In the item 10, the semiconductor chip tray further includes a plurality of island-shaped ribs (2b, 2d) that divide the housing space into a plurality of chip pockets (3) by being provided in island shapes on the top surface of the support plate so as to be separated from each other.

Therefore, even if the housing space is divided into a plurality of chip pockets (3), it is possible to obtain the same effect as in the item 1. Since the plurality of ribs have island shapes, the flow path of air between the plurality of chip pockets is secured in a gap between the ribs, and the housing space has a common space including the plurality of chip pockets. The number of common spaces may be one or more.

[12] Edge Ribs that Separate the Housing Space from the Outer Peripheral Rib

In the item 11, the semiconductor chip tray further includes a plurality of edge ribs (2a, 2c) that separate the chip pockets from an inner wall of the outer peripheral rib, and the edge ribs and the island-shaped ribs are formed at positions that are not in contact with corners of semiconductor chips housed in the chip pockets.

Therefore, since the corners of each IC chip housed are not in contact with any inner wall in the semiconductor chip tray, it is possible to suppress the occurrence of scratches or chipping at the corners of the IC chip and to suppress the generation of foreign matter due to the inner wall of the chip tray being scraped by the IC chip. The edge ribs (2a, 2c) may be in contact with the inner wall of the outer peripheral rib (2e), and may be united with the outer peripheral rib (2e) at the contact portion. Alternatively, the edge ribs (2a, 2c) may be disposed away from the inner wall of the outer peripheral rib (2e).

[13] Arrangement of the Recess

In the item 12, when viewed through the semiconductor chip tray from a direction perpendicular to the top and bottom surfaces of the semiconductor chip tray, the recess is disposed at a position that does not overlap the plurality of edge ribs, and has a width in a vertical direction that ranges from an outer wall of the outer peripheral rib to an inner position rather than the inner wall of the outer peripheral rib and does not extend up to the chip pocket.

In this case, even if semiconductor chip trays are used in a state in which the semiconductor chip trays overlap each other, the recess (4) provided on the bottom surface of the semiconductor chip tray on the lid side is formed at a position that does not overlap the chip pocket (3). Therefore, there is no possibility that the surface of an IC chip housed in the chip pocket (3) will be in contact with the recess (4) on the lid side. As a result, even when an IC chip having a bump formed on its surface is housed, it is possible to prevent the occurrence of scratching, chipping, peeling, and the like on the bump.

[14] Arrangement of the Recess=Position without a Chip Pocket (FIG. 1)

In the item 13, the plurality of island-shaped ribs include a plurality of vertical-column island-shaped ribs (2d) that divide the plurality of chip pockets into left and right columns, and the recess is disposed on an extension line in the vertical direction of a column (2d, . . . , 2d) by the vertical-column island-shaped ribs.

Therefore, since the recess (4) is disposed between the columns of chip pockets that are left and right columns in the vertical direction, the same effect as in the item 13 is obtained. The number of columns of the chip pocket (3) in the vertical direction may be three or more, and the number of columns (2d, . . . , 2d) of vertical-column island-shaped ribs may be two or more.

[15] Arrangement of the Recess=Positions in Contact with Left and Right Sides of the Outer Peripheral Rib (FIG. 5)

In the item 12, when viewed through the semiconductor chip tray from a direction perpendicular to top and bottom surfaces of the semiconductor chip tray, the recess overlaps upper and lower sides of the outer peripheral rib, is formed at a position that is in contact with left and right sides of the outer peripheral rib, and has a width in a vertical direction that does not extend up to the chip pocket.

Therefore, the same effect as in the item 13 is obtained.

[16] Thinning the Outer Peripheral Rib Facing the Recess (FIG. 6)

In the item 12, when the semiconductor chip tray is stacked so as to overlap another semiconductor chip tray having the same configuration as the semiconductor chip tray, a part (2f) of the outer peripheral rib facing a recess of the other semiconductor chip tray has a width in a vertical direction that is smaller than the other portion of the outer peripheral rib and is smaller than the recess.

Therefore, even if the recess (4) is provided on the extension of the column of the plurality of chip pockets (3) in the vertical direction, it is possible to obtain the same effect as in the item 1. Since the chip pocket (3) is disposed on the inner side by the width of the edge rib (2c) from the inner wall of the outer peripheral rib (2e) by the edge rib (2c), the flow path of air is formed by appropriately designing the width of the part (2f) of the outer peripheral rib and the width of the bottom recess (4) as described above.

[17] Recess Connecting a Plurality of Chip Pockets (FIG. 4)

In the item 10, assuming that the recess is a first recess (4), the semiconductor chip tray includes a plurality of chip pockets (3) provided on the top surface of the support plate so as to be separated from each other, and a second recess (6) that forms the housing space by connecting the plurality of chip pockets to each other.

When the semiconductor chip tray is stacked so as to overlap another semiconductor chip tray having the same configuration as the semiconductor chip tray, a part of the second recess is formed at a position facing a first recess of the other semiconductor chip tray.

Therefore, also in the semiconductor chip tray (1) in which the housing space is formed by connecting the plurality of chip pockets (3) to each other by the second recess (6), it is possible to obtain the same effect as in the item 1. A plurality of housing spaces may be formed in one semiconductor chip tray. In this case, since the flow path of air by the first recess is formed corresponding to each of the housing spaces, the occurrence of sticking due to vacuum suction is prevented.

2. FURTHER DETAILED DESCRIPTION OF THE EMBODIMENTS

An embodiment will be further described in detail.

[First Embodiment]

Semiconductor Chip Tray Having a Recess for Air Vent on the Bottom Surface

Figure 2:
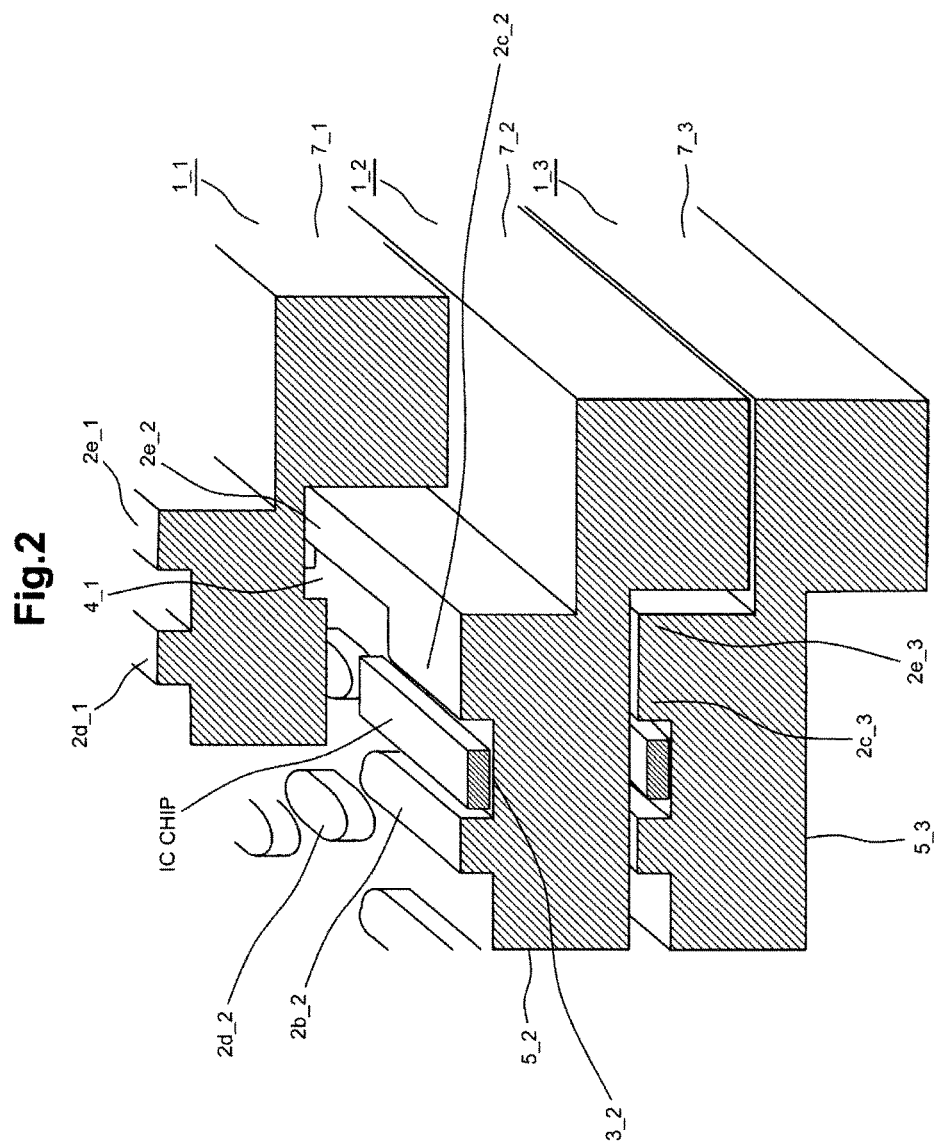
FIG. 2 is an explanatory view showing the operation of the semiconductor chip tray in FIG. 1.
Figure 3:
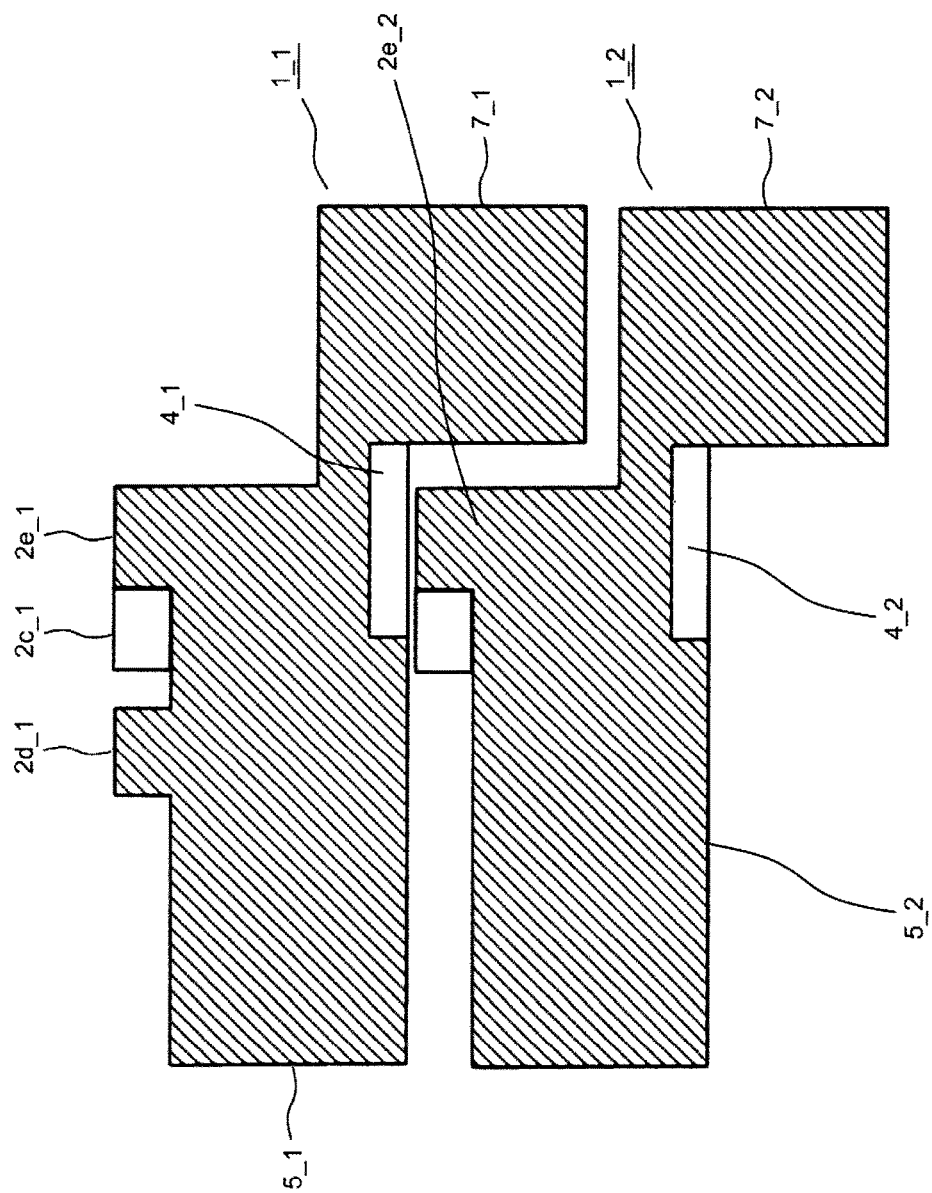
FIG. 3 is a sectional view obtained by enlarging a part of the explanatory view of FIG. 2.
Figure 9:
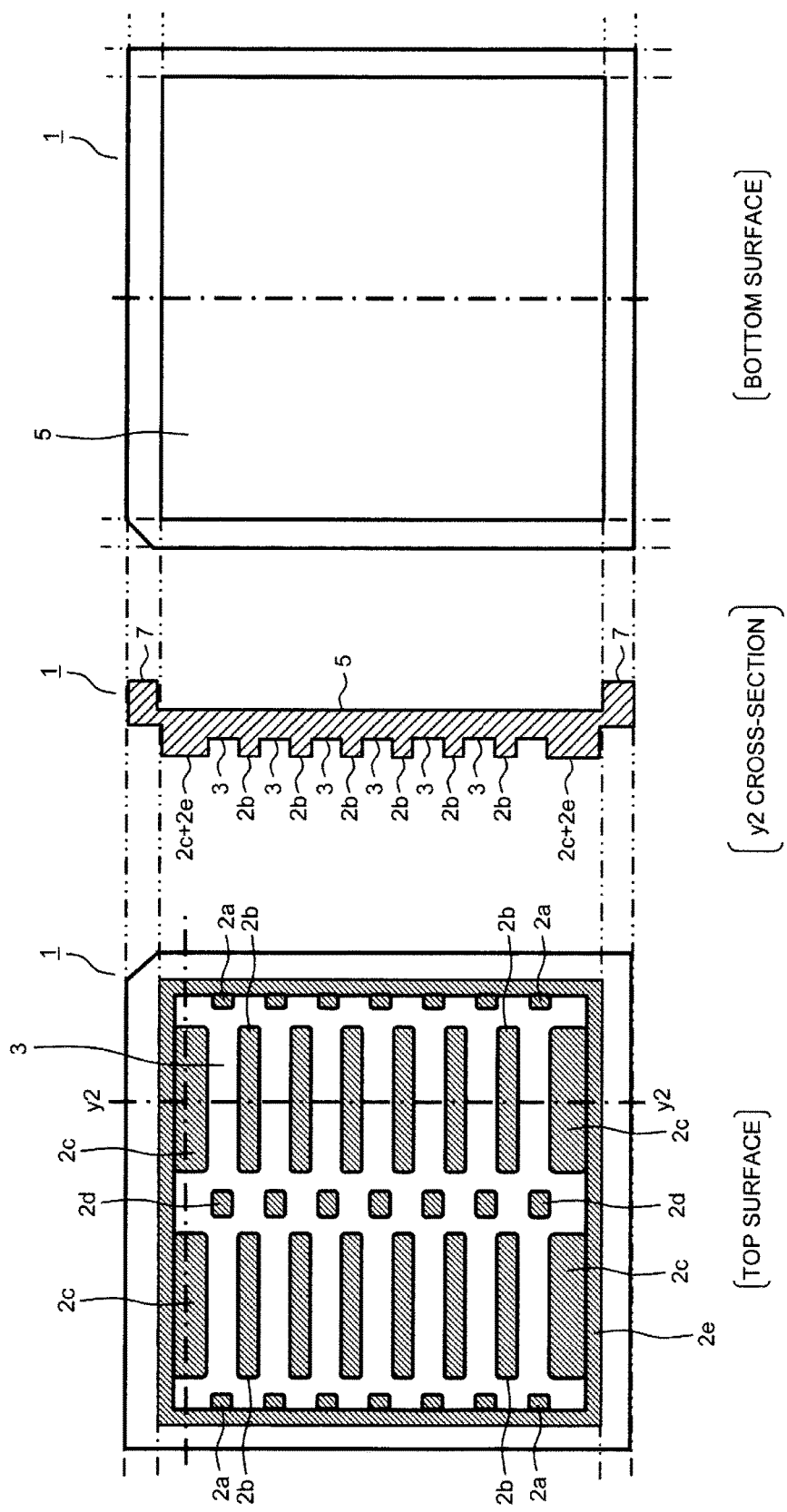
FIG. 9 is a diagram showing the structure of a semiconductor chip tray in a comparative example.
Figure 10:
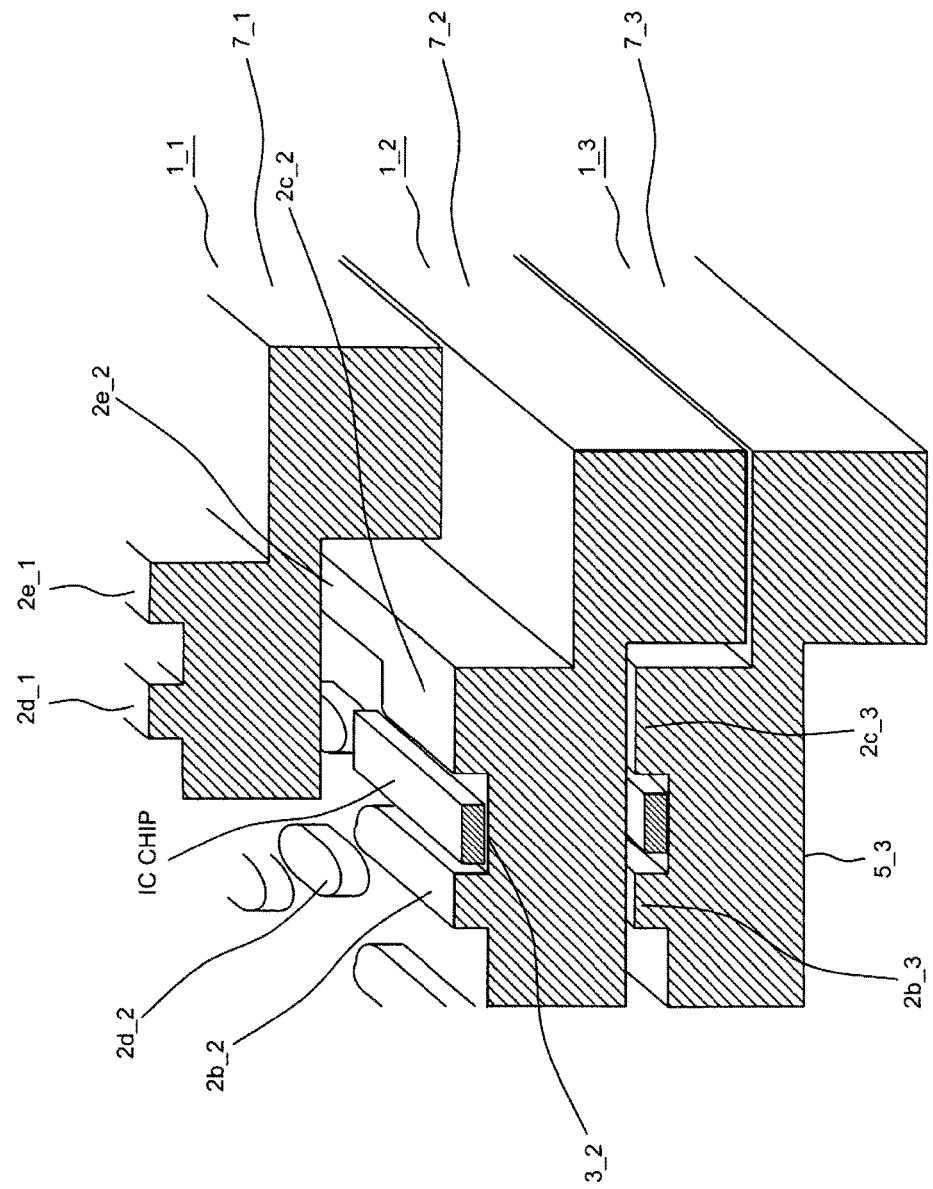
FIG. 10 is an explanatory view showing the operation of the semiconductor chip tray in FIG. 9.
Figure 11:
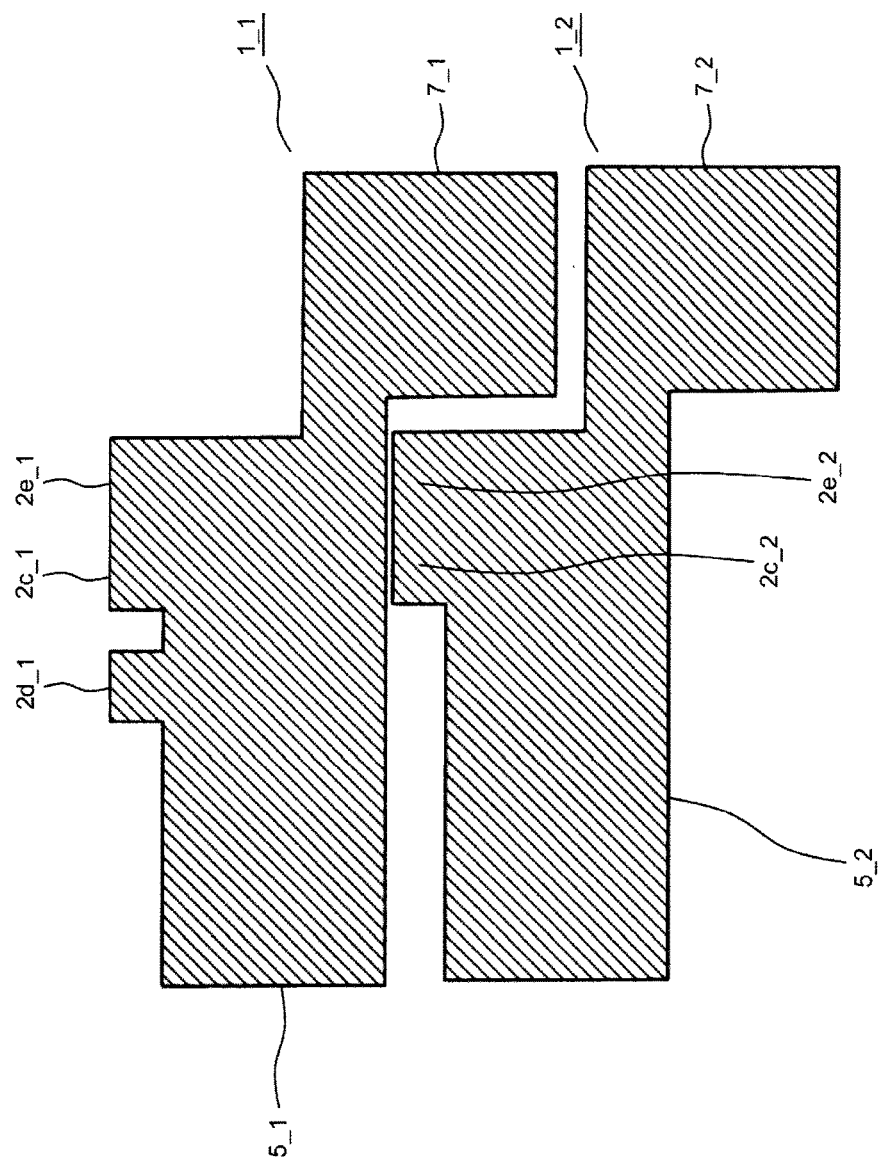
FIG. 11 is a sectional view obtained by enlarging a part of the explanatory view of FIG. 10.

FIG. 1 is a diagram showing the structure of a semiconductor chip tray 1 according to a first embodiment, FIG. 2 is an explanatory view showing the operation of the semiconductor chip tray 1 shown in FIG. 1, and FIG. 3 is a sectional view showing a part of the explanatory view of FIG. 2 in an enlarged manner. In addition, FIG. 9 is a diagram showing the structure of a semiconductor chip tray 1 in a comparative example, FIG. 10 is an explanatory view showing the operation of the semiconductor chip tray 1 shown in FIG. 9, and FIG. 11 is a sectional view showing a part of the explanatory view of FIG. 10 in an enlarged manner.

A top view, a y1 sectional view, a y2 sectional view, a bottom view, and an X cross-sectional view are shown in FIG. 1. In the top view, the front side of the paper is a top surface of the semiconductor chip tray 1. In the bottom view, the front side of the paper is a bottom surface. In the y1 sectional view and the y2 sectional view, the left side is a top surface and the right side is a bottom surface. In the X cross-sectional view, the lower side is a top surface and the upper side is a bottom surface.

The semiconductor chip tray 1 of the first embodiment includes an outer peripheral rib 2e provided in a rectangular shape on the top surface side of a support plate 5. The outer peripheral rib 2e is a protruding portion having a fixed height, and forms a closed space when capped with a flat plate. This space is a housing space including a plurality of chip pockets 3. The housing space is divided into a plurality of chip pockets 3 by a plurality of ribs 2a, 2b, 2c, and 2d. Among the plurality of ribs, the edge ribs 2a provided in contact with the left and right sides of the outer peripheral rib 2e define the right or left side of the chip pocket 3 at a position away from the left and right sides of the outer peripheral rib 2e. The other right or left side of the chip pocket 3 is defined by the island-shaped rib 2d. Among the plurality of ribs, the edge ribs 2c provided in contact with the upper and lower sides of the outer peripheral rib 2e define the upper or lower side of the chip pocket 3 at a position away from the upper and lower sides of the outer peripheral rib 2e. The other upper or lower side of the chip pocket 3 is defined by the island-shaped rib 2b. In FIG. 1, the semiconductor chip tray 1 including two left and right columns of chip pockets 3 is shown. However, the number of chip pockets 3 per column and the number of columns are arbitrary. The semiconductor chip tray 1 includes an outer peripheral rib 7 that is provided in a rectangular shape on the bottom surface side of the support plate 5. The outer peripheral rib 7 is configured so as to be slightly larger than the outer peripheral rib 2e on the top surface side and to be fitted to (engaged with) the outer peripheral rib 2e when the semiconductor chip trays 1 having the same structure are stacked so as to overlap each other. A recess 4 (4n and 4s) is further provided on the bottom surface side of the support plate 5. The recess 4 is provided at a position facing a part of the outer peripheral rib 2e when the semiconductor chip trays 1 having the same structure are stacked so as to overlap each other, and has a size from the aforementioned housing space to the outside of the outer peripheral rib 2e.

The operation of the first embodiment will be described.

FIG. 2 is an explanatory view showing the operation of the semiconductor chip tray 1 in FIG. 1. Three semiconductor chip trays 1_1 to 1_3 having the same structure are stacked so as to overlap each other, and the y1 cross-section of the upper semiconductor chip tray 1_1 and the y2 cross-sections of the middle and lower semiconductor chip trays 1_2 and 1_3 are shown in plan view. FIG. 3 is a sectional view, which is obtained by enlarging a part of the y1 cross-section in a state in which the upper and middle semiconductor chip trays 1_1 and 1_2 are stacked so as to overlap each other, in the explanatory view of FIG. 2. FIGS. 9 to 11 are diagrams showing the structure of the semiconductor chip tray 1 in a comparative example. FIG. 9 corresponds to FIG. 1, FIG. 10 corresponds to FIG. 2, and FIG. 11 corresponds to FIG. 3.

The semiconductor chip tray 1 of the comparative example has the same structure as the semiconductor chip tray 1 of the first embodiment except that the recess 4 is not provided.

Both the semiconductor chip tray 1 of the first embodiment and the semiconductor chip tray 1 of the comparative example are surrounded by the outer peripheral rib 2e, so that the housing space is formed. Although the housing space is divided into the plurality of chip pockets 3 by the plurality of ribs 2a, 2b, 2c, and 2d, the plurality of chip pockets 3 are connected to each other to form a common space. When the semiconductor chip trays 1_1 to 1_3 having the same structure are stacked so as to overlap each other, in the semiconductor chip tray 1 of the comparative example, as shown in FIGS. 10 and 11, the outer peripheral rib 2e is in close contact with the bottom surface of the support plate 5 of the semiconductor chip tray 1 on the lid side (upper side) in both the y1 cross-section and the y2 cross-section or in other cross-sections. Although a small gap is drawn in FIGS. 10 and 11, the gap becomes extremely small as the amount of warpage of the semiconductor chip tray 1 decreases. Accordingly, the air flow between the housing space including the plurality of chip pockets 3 and the outside is blocked. When the housing space is in the negative pressure, a vacuum suction state occurs. In this case, when the semiconductor chip tray 1 on the lid side (upper side) is lifted, the semiconductor chip tray 1 on the lower side may be lifted together with the semiconductor chip tray 1 on the lid side (upper side) (sticking due to vacuum suction). Then, the semiconductor chip tray 1 on the lower side may fall by the release of suction due to its own weight. This problem becomes more significant as the volume of the housing space becomes larger and the amount of warpage of the semiconductor chip tray 1 becomes smaller.

In contrast, in the semiconductor chip tray 1 of the first embodiment, the flow path for air to flow from the housing space of the semiconductor chip tray 1 to the outside is formed. Accordingly, the occurrence of a vacuum suction state is prevented. As shown in FIG. 2 in which the semiconductor chip trays 1_2 and 1_3 are used, in the y2 cross-section, an outer peripheral rib 2e_3 (including a rib 2c_3 adjacent thereto) is in close contact with the bottom surface of a support plate 5_2 of the semiconductor chip tray 1 on the lid side (upper side). However, as shown in FIGS. 2 and 3 in which the semiconductor chip trays 1_1 and 1_2 are used, in the y1 cross-section, a recess 4_1 is provided on the bottom surface of a support plate 5_1 of the semiconductor chip tray 1 on the lid side (upper side) facing the outer peripheral rib 2e_2. Accordingly, since the flow path for air to flow from the housing space of the semiconductor chip tray 1_2 to the outside is formed, the occurrence of a vacuum suction state is prevented.

Thus, when the semiconductor chip tray 1 is stacked so as to overlap another semiconductor chip tray having the same structure, the recess 4 forms a flow path for air to flow from the housing space of the other semiconductor chip tray to the outside. As a result, it is possible to prevent the occurrence of sticking due to vacuum suction. It is not necessary to provide a through hole on the bottom surface of the chip pocket 3 or to provide irregularities on the outer peripheral rib 2e, and an increase in the cost due to providing an additional processing step for the semiconductor chip tray 1 or the like does not occur.

Although the support plate 5, the plurality of island-shaped ribs 2a, 2b, 2c, and 2d on the top surface side, and the outer peripheral ribs 2e and 7 on the top and bottom surface sides are referred to as separate names for convenience of explanation, the semiconductor chip tray 1 does not need to be configured by combining these separate structures. For example, ribs, formed from polystyrene (PS) resin or acrylonitrile butadiene styrene copolymer (ABS) resin, may be integrally formed with the semiconductor chip tray by injection molding.

In the semiconductor chip tray $1_{1\_2}$ 2 illustrated in FIG. 1, when another semiconductor chip tray 1 having the same structure is stacked so as to overlap the semiconductor chip tray 1_2, the recess 4 is formed at a position deviating from all of the plurality of chip pockets 3 of the other semiconductor chip tray 1. As shown in FIG. 2, in the y1 cross-section where the recess 4_1 is formed on the bottom surface of the semiconductor chip tray 1_1 on the lid side (upper side), a chip pocket 3_2 of the semiconductor chip tray 1_2 is not formed. However, as shown in FIGS. 2 and 3, a chip pocket 3_3 of the semiconductor chip tray 1_3 is formed in the y2 cross-section where the recess 4_2 is not formed on the bottom surface of the semiconductor chip tray 1_2 on the lid side (upper side).

Therefore, since the recess 4 is not in contact with the surface of an IC chip housed in the chip pocket 3 of the lower semiconductor chip tray 1, it is possible to prevent the occurrence of scratching, chipping, peeling, and the like on the surface bump of the IC chip.

In addition, the upper side recess 4n and the lower side recess 4s are formed on the extension line of the column of a vertical direction (y1-y1 direction) of the ribs 2d, . . . , 2d arranged on the y1-y1 straight line.

Therefore, it is possible to maintain the symmetry of the planar shape of the semiconductor chip tray 1. As shown in FIG. 1, when the housing space is divided into chip pocket columns of two left and right columns by the plurality of ribs 2d, . . . , 2d, the recesses 4n and 4s are disposed on the center line of the left and right. Therefore, the semiconductor chip tray 1 can be formed symmetrically. Even if the housing space is divided into chip pocket columns of three or more columns, the symmetry of the planar shape of the semiconductor chip tray 1 is maintained by making the width of the chip pocket 3 equal between the columns. Warping is suppressed by maintaining the symmetry.

While the semiconductor chip tray 1 illustrated in the first embodiment has been described, it is noted that, when the semiconductor chip tray 1 is stacked so as to overlap another semiconductor chip tray 1 having the same structure, the flow path of air between the housing space that is a common space including the plurality of chip pockets 3 and the outside is formed on the bottom surface of the semiconductor chip tray 1 on the lid side (upper side) by the recess 4. There are various modifications to the position where the recess 4 is formed. Hereafter, several modifications will be described through second to fourth embodiments.

[Second Embodiment]

Semiconductor Chip Tray Having a Recess for Connecting Chip Pockets to Each Other FIG. 4 is a diagram showing the structure of a semiconductor chip tray 1 according to the second embodiment. A top view, a y2 sectional view, a bottom view, and an X cross-sectional view are shown in FIG. 4. Similar to FIG. 1, in the top view, the front side of the paper is a top surface of the semiconductor chip tray 1. In the bottom view, the front side of the paper is a bottom surface. In the y2 sectional view, the left side is a top surface and the right side is a bottom surface. In the X cross-sectional view, the lower side is a top surface and the upper side is a bottom surface.

In the semiconductor chip tray 1 according to the second embodiment, a plurality of chip pockets 3 are formed by a plurality of recesses formed on the surface of the support plate 5. As shown in FIG. 4, the plurality of chip pockets 3 are formed in two columns in the vertical direction, and a recess 6 in the vertical direction that connects the plurality of chip pockets 3, which form each column, to each other is formed. A common space is formed by the plurality of chip pockets 3 and the recess 6 that connects the chip pockets 3. Unlike in the first embodiment, an example in which two common spaces per one semiconductor chip tray 1 are formed is shown in FIG. 4. A rib 2 that is a protruding portion surrounding the common space corresponds to the outer peripheral rib 2e. When the semiconductor chip tray 1 is stacked so as to overlap another semiconductor chip tray 1 having the same structure, the bottom recess 4 faces a part of the rib 2 of the other semiconductor chip tray 1, and is formed extending up to the outside of the rib 2 from the housing space that is formed by the rib 2. That is, the recess 6 and the bottom recess 4 are portions overlapping each other when the semiconductor chip tray 1 is viewed from a direction perpendicular to the surface, and the bottom recess 4 is formed extending up to the outside of the rib 2. When the semiconductor chip tray 1 is stacked so as to overlap another semiconductor chip tray 1 having the same structure, the flow path of air is formed from the common space (housing space) including the plurality of chip pockets 3 by the recess 6 and the bottom recess 4 of the semiconductor chip tray 1 on the lid side (upper side). Therefore, as in the first embodiment, it is possible to prevent the occurrence of sticking due to vacuum suction. In addition, it is not necessary to provide a through hole on the bottom surface of the chip pocket 3 or to provide irregularities on the outer peripheral rib 2, and an increase in the cost due to providing an additional processing step for the semiconductor chip tray 1 or the like does not occur.

The position where the bottom recess 4 is formed may be in a position that does not overlap the chip pocket 3 even when the semiconductor chip trays 1 are stacked so as to overlap each other. Therefore, since the bottom recess 4 is not in contact with the surface of an IC chip housed in the chip pocket 3 of the lower semiconductor chip tray 1, it is possible to prevent the occurrence of scratching, chipping, peeling, and the like on the surface bump of the IC chip.

[Third Embodiment]

Semiconductor Chip Tray in which a Bottom Recess is Fully Formed from Left to Right FIG. 5 is a diagram showing the structure of a semiconductor chip tray 1 according to the third embodiment. A top view, a y1 sectional view, a bottom view, and an X cross-sectional view are shown in FIG. 5. Similar to FIGS. 1 and 4, in the top view, the front side of the paper is a top surface of the semiconductor chip tray 1. In the bottom view, the front side of the paper is a bottom surface. In the y1 sectional view, the left side is a top surface and the right side is a bottom surface. In the X cross-sectional view, the lower side is a top surface and the upper side is a bottom surface.

In the semiconductor chip tray 1 according to the third embodiment, the surface shape is the same as that of the semiconductor chip tray 1 of the first embodiment shown in FIG. 1, but the shape of the recess 4 on the bottom surface side is different. On the top surface side, a housing space is formed by the outer peripheral rib 2e, and the housing space is divided into a plurality of chip pockets 3 by a plurality of ribs 2a, 2b, 2c, and 2d. Others are the same as those in the first embodiment, and explanation thereof will be omitted.

On the bottom surface side, the outer peripheral rib 7 provided on the support plate 5 is configured so as to be slightly larger than the outer peripheral rib 2e on the top surface side and to be fitted to (engaged with) the outer peripheral rib 2e when the semiconductor chip trays 1 having the same structure are stacked so as to overlap each other. This is the same as the semiconductor chip tray 1 of the first embodiment. On the other hand, the recess 4 (4n and 4s) is formed on one of the upper and lower sides and a position where each of the left and right sides is in contact with the outer peripheral rib 7, unlike in the first embodiment. The recess 4 is provided at a position facing a part of the outer peripheral rib 2e when the semiconductor chip trays 1 having the same structure are stacked so as to overlap each other, and has a size from the aforementioned housing space to the outside of the outer peripheral rib 2e.

Thus, also in the semiconductor chip tray 1 of the third embodiment, as in the first embodiment, the flow path for air to flow from the housing space of the semiconductor chip tray 1 to the outside is formed. Accordingly, the occurrence of sticking due to vacuum suction is prevented.

In addition, by forming the recess 4 in a width (length in the vertical direction) not overlapping the chip pocket 3 when the semiconductor chip trays 1 having the same structure are stacked so as to overlap each other, the recess 4 is not in contact with the surface of an IC chip housed in the chip pocket 3 of the lower semiconductor chip tray 1. Therefore, it is possible to prevent the occurrence of scratching, chipping, peeling, and the like on the surface bump of the IC chip.

The recess 4 on the bottom surface side may be formed so that at least one place faces the positions without the ribs 2a, 2b, 2c, and 2d on the top surface side when the semiconductor chip tray 1 is stacked so as to overlap another semiconductor chip tray 1 having the same structure. For example, as shown in the x cross-section of FIG. 5, the recess 4 on the bottom surface side may be formed in a wavy cross-section. The sectional shape is not limited to the wave shape, and may be a square shape or a round shape. Therefore, since the shape on the bottom surface side can be unified regardless of the arrangement of the pockets 3 formed on the surface of the semiconductor chip tray, it is possible to use the mold on the bottom surface side in common. In addition, by forming the cross-section of the recess in a wave shape or the like instead of a recess having a fixed depth, it is possible to reduce the warpage of the semiconductor chip tray 1.

[Fourth Embodiment]

Figure 7:
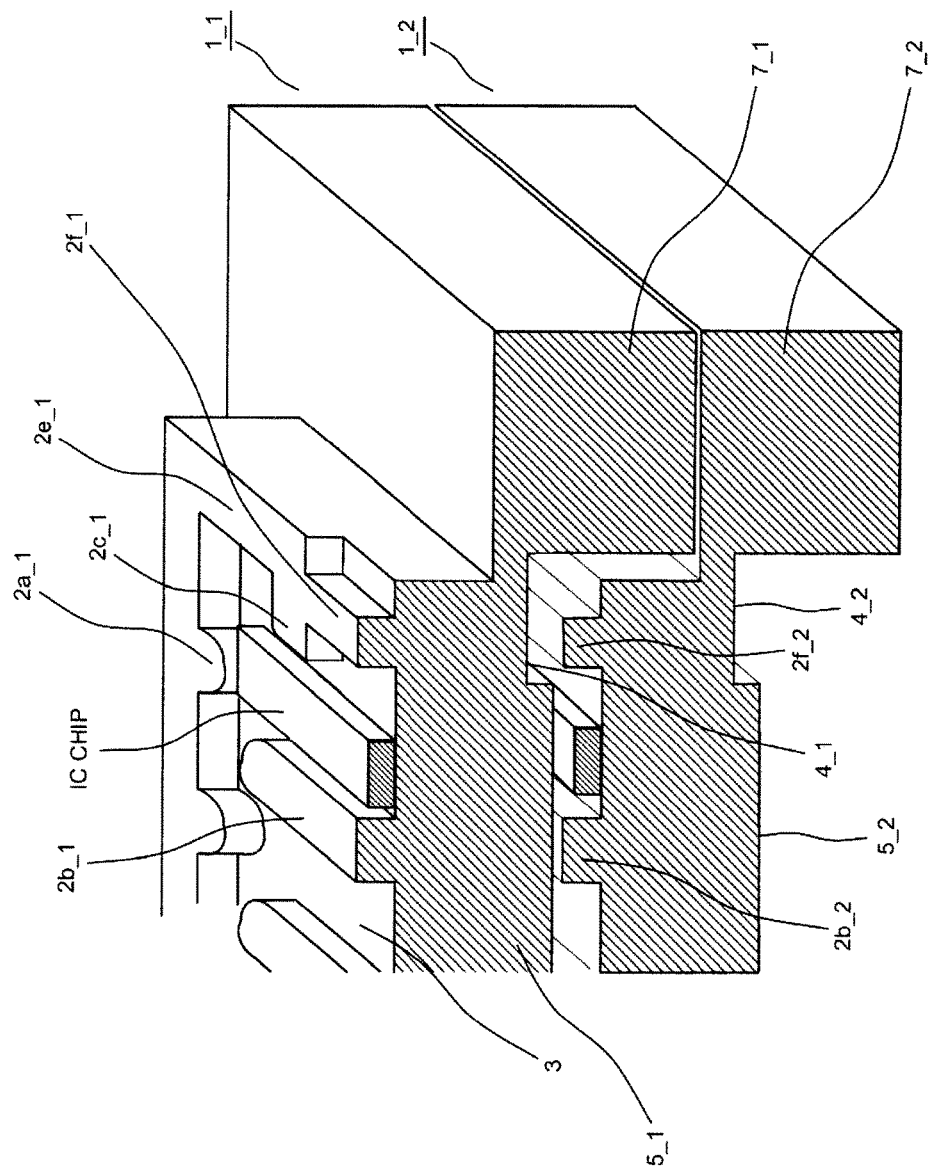
FIG. 7 is an explanatory view showing the operation of the semiconductor chip tray in FIG. 6.
Figure 8:
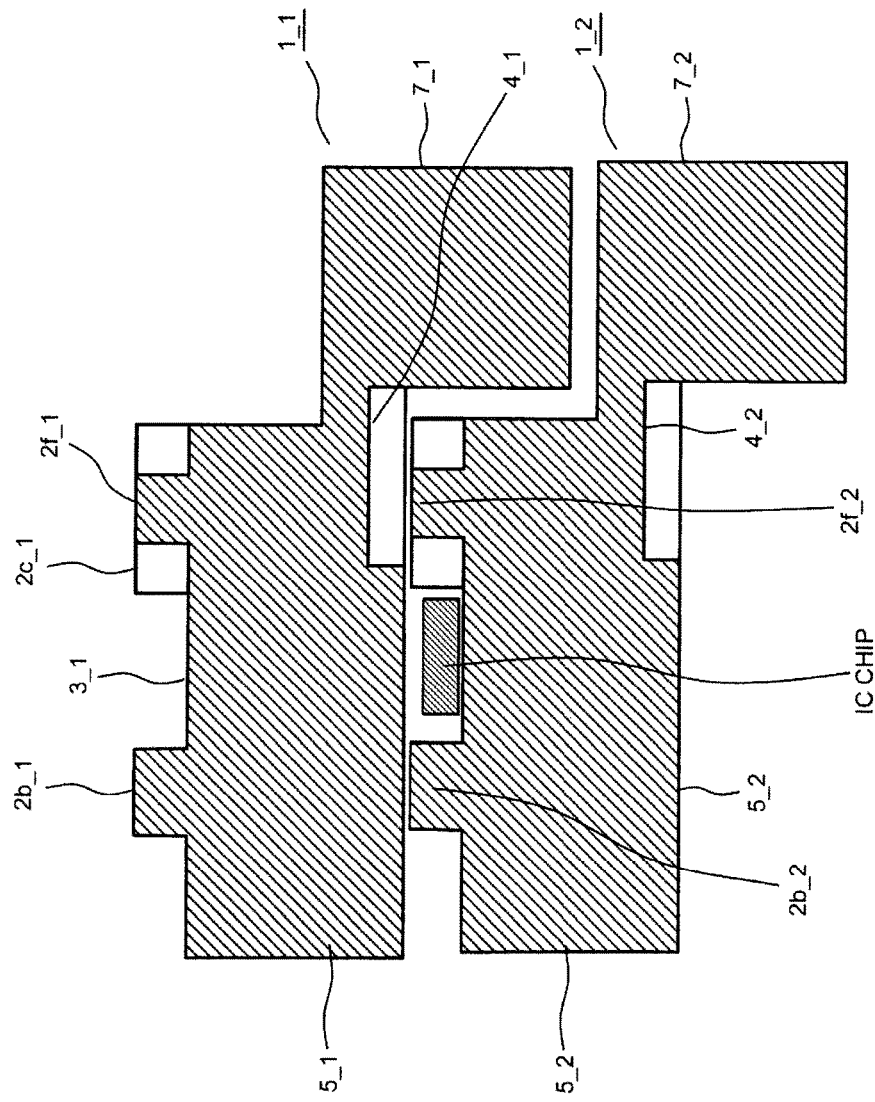
FIG. 8 is a sectional view obtained by enlarging a part of the explanatory view of FIG. 7.

Semiconductor Chip Tray in which an Outer Peripheral Rib Facing a Bottom Recess is Narrow FIG. 6 is a diagram showing the structure of a semiconductor chip tray 1 according to the fourth embodiment, FIG. 7 is an explanatory view showing the operation of the semiconductor chip tray 1 shown in FIG. 6, and FIG. 8 is a sectional view showing a part of the explanatory view of FIG. 7 in an enlarged manner. Similar to FIG. 1, a top view, a y1 sectional view, a y2 sectional view, a bottom view, and an X cross-sectional view are shown in FIG. 6. In the top view, the front side of the paper is a top surface of the semiconductor chip tray 1. In the bottom view, the front side of the paper is a bottom surface. In the y1 sectional view and the y2 sectional view, the left side is a top surface and the right side is a bottom surface. In the X cross-sectional view, the lower side is a top surface and the upper side is a bottom surface.

The semiconductor chip tray 1 of the fourth embodiment includes outer peripheral ribs 2e and 2f that are provided on the top surface side of the support plate 5. When compared with the semiconductor chip tray 1 of the first embodiment shown in FIG. 1, a part of the outer peripheral rib 2e is made narrow toward the inside to form the rib 2f. The outer peripheral ribs 2e and 2f are protruding portions having fixed heights, and form a closed space when capped with a flat plate. This space is a housing space having a plurality of chip pockets 3. As in the first embodiment, the housing space is divided into a plurality of chip pockets 3 by a plurality of ribs 2a, 2b, 2c, and 2d. Among the plurality of ribs, the edge ribs 2a provided that are in contact with the left and right sides of the outer peripheral rib 2e define the right or left side of the chip pocket 3 at a position away from the left and right sides of the outer peripheral rib 2e. The other right or left side of the chip pocket 3 is defined by the island-shaped rib 2d. Among the plurality of ribs, the edge ribs 2c provided that are in contact with the upper and lower sides of the outer peripheral rib 2e define the upper or lower side of the chip pocket 3 at a position away from the upper and lower sides of the outer peripheral rib 2e. The other upper or lower side of the chip pocket 3 is defined by the island-shaped rib 2b. Unlike in the first embodiment, a part of the edge rib 2c is narrowed to form the outer peripheral rib 2f described above. On the bottom surface side of the semiconductor chip tray 1, as in the first embodiment, the outer peripheral rib 7 provided on the support plate 5 is configured so as to be slightly larger than the outer peripheral rib 2e on the top surface side and to be fitted to (engaged with) the outer peripheral rib 2e when the semiconductor chip trays 1 having the same structure are stacked so as to overlap each other. The recess 4 provided on the bottom surface side of the support plate 5 is provided at a position facing a part of the outer peripheral rib 2f when the semiconductor chip trays 1 having the same structure are stacked so as to overlap each other, and has a size from the aforementioned housing space to the outside of the outer peripheral rib 2f. In FIG. 6, the semiconductor chip tray 1 including two left and right columns of chip pockets 3 is shown. However, the number of chip pockets 3 per column and the number of columns are arbitrary.

The operation of the fourth embodiment will be described.

FIG. 7 is an explanatory view showing the operation of the semiconductor chip tray 1 in FIG. 6. In FIG. 7, two semiconductor chip trays 1_1 and 1_2 having the same structure are stacked so as to overlap each other, and cross-sections including a part of the y2 cross-section are shown in plan view. FIG. 8 is a sectional view, which is obtained by enlarging a part of the y2 cross-section in a state in which the upper and lower semiconductor chip trays 1_1 and 1_2 are stacked so as to overlap each other, in the explanatory view of FIG. 7. FIGS. 7 and 8 correspond to FIGS. 2 and 3 regarding the structure of the semiconductor chip tray 1 of the first embodiment, respectively.

The semiconductor chip tray 1 of the fourth embodiment is surrounded by the outer peripheral ribs 2e and 2f, so that the housing space is formed. Although the housing space is divided into the plurality of chip pockets 3 by the plurality of ribs 2a, 2b, 2c, and 2d, the plurality of chip pockets 3 are connected to each other to form a common space as in the first embodiment or the comparative example.

As described above, in the semiconductor chip tray 1 of the first embodiment, the flow path for air to flow from the housing space of the semiconductor chip tray 1 to the outside is formed. Accordingly, the occurrence of a vacuum suction state is prevented. In the semiconductor chip tray 1 of the fourth embodiment, as shown in FIGS. 7 and 8, in the y2 cross-section, a recess 4_1 is provided on the bottom surface of a support plate 5_1 of the semiconductor chip tray 1 on the lid side (upper side) facing the outer peripheral rib 2f_2. Accordingly, since the flow path for air to flow from the housing space of the semiconductor chip tray 1_2 to the outside is formed, the occurrence of a vacuum suction state is prevented. Thus, also in the semiconductor chip tray 1 of the fourth embodiment, as in the first embodiment, the flow path for air to flow from the housing space of the semiconductor chip tray 1 to the outside is formed. Accordingly, the occurrence of sticking due to vacuum suction is prevented. In addition, by forming the recess 4 in a width (length in the vertical direction) not overlapping the chip pocket 3 when the semiconductor chip trays 1 having the same structure are stacked so as to overlap each other, the recess 4 is not in contact with the surface of an IC chip housed in the chip pocket 3 of the lower semiconductor chip tray 1. Therefore, it is possible to prevent the occurrence of scratching, chipping, peeling, and the like on the surface bump of the IC chip.

While the invention made by the present inventors has been specifically described through the above embodiments, it is needless to say that the invention is not limited thereto and various modifications thereof can be made without departing from the spirit and scope of the invention.

What is claimed is:

1. A semiconductor chip tray, comprising:
    a support plate;
    a first protruding portion;
    a second protruding portion; and
    a plurality of ribs,
    wherein the first protruding portion protrudes from a top surface of the support plate and circumscribes the support plate at the edge thereof to form a housing space,
    wherein the second protruding portion protrudes from a bottom surface of the support plate,
    wherein the support plate has a first recess provided on the bottom surface of the support plate,
    wherein the ribs define a plurality of chip pockets in the housing space, each of the chip pockets being adapted to house a semiconductor chip,
    wherein the ribs are arranged apart from one another so that the chip pockets communicate with one another via gaps each formed between two of the ribs,
    wherein, when the semiconductor chip tray is stacked to overlap another semiconductor chip tray having the same configuration as the semiconductor chip tray so that the bottom surface of the support plate of the semiconductor chip tray faces the top surface of the support plate of the other semiconductor chip tray, a flow path of air is formed which communicates the housing space of the other semiconductor chip tray with a space positioned outside of the first protruding portion of the other semiconductor chip tray via the first recess of the semiconductor chip tray.

2. The semiconductor chip tray according to claim 1, wherein, when the semiconductor chip tray is stacked to overlap the other semiconductor chip tray so that the bottom surface of the support plate of the semiconductor chip tray is facing the top surface of the support plate of the other semiconductor chip tray, the first recess is positioned at a position deviating from all of the plurality of chip pockets of the other semiconductor chip tray.

3. The semiconductor chip tray according to claim 1, wherein the ribs include:
    a plurality of first ribs arrayed in a column which extends in a first direction directed along the top surface of the support plate; and
    a plurality of second ribs arrayed in a column which extends in the first direction,
    a plurality of third ribs arrayed in a column which extends in the first direction,
    wherein the columns of the first to third ribs are arrayed in a second direction perpendicular to the first direction and the column of the first ribs is located between the columns of the second and third ribs,
    wherein each of the second ribs are aligned in the second direction with a corresponding one of the third ribs, and
    wherein the first ribs are misaligned from the second and third ribs in the first direction.

4. The semiconductor chip tray according to claim 3, wherein the support plate further has a second recess provided on the bottom surface of the support plate,
    wherein, when the semiconductor chip tray is stacked to overlap another semiconductor chip tray so that the bottom surface of the support plate of the semiconductor chip tray is facing the top surface of the support plate of the other semiconductor chip tray, another flow path of air is formed which communicates the housing space of the other semiconductor chip tray with a space positioned outside of the first protruding portion of the other semiconductor chip tray via the second recess of the semiconductor chip tray
    wherein the first protruding portion includes:
        a first portion provided at an edge face of the support plate,
        a second portion provided at another edge face of the support plate,
    wherein the first recess is positioned in the vicinity of the first portion of the first protruding portion, and
    wherein the second recess is positioned in the vicinity of the second portion of the first protruding portion.

5. The semiconductor chip tray according to claim 4, wherein, when the semiconductor chip tray is stacked to overlap another semiconductor chip tray so that the bottom surface of the support plate of the semiconductor chip tray is facing the top surface of the support plate of the other semiconductor chip tray, the first recess and the second recess of the semiconductor chip tray are facing the first protruding portion of the other semiconductor chip tray.

6. The semiconductor chip tray according to claim 5,
wherein a plurality of projections having the same width as a width in the vertical direction included in each of the first recess and the second recess have wavy sectional shapes.

7. The semiconductor chip tray according to claim 4,
wherein, when the semiconductor chip tray is stacked to overlap the other semiconductor chip tray, widths of portions of the first protruding portion are smaller than widths of the first recess and the second recess.

8. A semiconductor chip tray, comprising:
a support plate;
an outer peripheral rib provided on a top surface side of the support plate to circumscribes the support plate at an edge of the support plate; and
a plurality of ribs provided on the top surface side of the support plate,
wherein the support plate has a recess provided on a bottom surface side of the support plate,
wherein the outer peripheral rib is a strip-shaped protruding portion having a fixed height, and circumscribes the support plate at the edge of the support plate to form a housing space there inside,
wherein the plurality of ribs define a plurality of chip pockets in the housing space, each of the chip pockets being adapted to house a semiconductor chip,
wherein the plurality of ribs are arranged apart from one another so that the chip pockets communicate with one another via gaps each formed between adjacent two of the ribs, and
wherein, when the semiconductor chip tray is stacked to overlap another semiconductor chip tray having the same configuration as the semiconductor chip tray so that the bottom surface of the support plate of the semiconductor chip tray is facing the top surface of the support plate of the other semiconductor chip tray, the recess of the semiconductor chip tray faces a part of the outer peripheral rib of the other semiconductor chip tray, and the recess of the semiconductor chip tray is provided at a position where a flow path of air from the housing space of the other semiconductor chip tray to a space positioned outside the outer peripheral rib is formed through the recess of the semiconductor chip tray.

9. The semiconductor chip tray according to claim 8,
wherein the plurality of ribs include a plurality of edge ribs that separate the chip pockets from an inner wall of the outer peripheral rib, and
wherein the ribs are formed at positions that are not in contact with corners of semiconductor chips housed in the chip pockets.

10. The semiconductor chip tray according to claim 9,
wherein, when viewed through the semiconductor chip tray from a direction perpendicular to the top and bottom surfaces of the semiconductor chip tray, the recess is disposed at a position that does not overlap the plurality of edge ribs, the recess extending from an outer wall of the outer peripheral rib to an inner position inside of the inner wall of the outer peripheral rib, and the recess not overlapping the chip pockets.

\* \* \* \* \*